(12) United States Patent
Sasaki et al.

(10) Patent No.: US 8,587,373 B2
(45) Date of Patent: Nov. 19, 2013

(54) POWER AMPLIFIER

(75) Inventors: Yoshinobu Sasaki, Tokyo (JP); Kazuya Yamamoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 13 days.

(21) Appl. No.: 13/488,493

(22) Filed: Jun. 5, 2012

(65) Prior Publication Data
US 2012/0326784 A1 Dec. 27, 2012

(30) Foreign Application Priority Data

Jun. 27, 2011 (JP) ................................. 2011-141807

(51) Int. Cl.
H03F 1/14 (2006.01)
(52) U.S. Cl.
USPC ............................................. 330/51; 330/302
(58) Field of Classification Search
USPC ............................... 330/51, 302, 310, 150, 98
See application file for complete search history.

(56) References Cited

U.S. PATENT DOCUMENTS

| | | | |
|---|---|---|---|
| 5,548,246 A | 8/1996 | Yamamoto et al. | |
| 6,603,359 B2 * | 8/2003 | Fujiwara et al. | 330/310 |
| 8,102,205 B2 * | 1/2012 | Pletcher et al. | 330/51 |
| 8,207,790 B2 * | 6/2012 | Asada et al. | 330/295 |

FOREIGN PATENT DOCUMENTS

| | | |
|---|---|---|
| JP | 7-336168 A | 12/1995 |
| WO | WO 2011/017463 A1 | 2/2011 |

OTHER PUBLICATIONS

Korean Patent Office, Office Action in Korean Patent Application No. 10-2012-0067791 (Jul. 19, 2013).

* cited by examiner

*Primary Examiner* — Henry Choe
(74) *Attorney, Agent, or Firm* — Leydig, Voit & Mayer, Ltd.

(57) ABSTRACT

A power amplifier includes: an input terminal at which an input signal is input; a first amplifier element amplifying the input signal; a second amplifier element amplifying an output signal of the first amplifier element; an output terminal from which an output signal of the second amplifier element is output; a matching circuit connected between an output of the second amplifier element and the output terminal; a first switch connected between an output of the first amplifier element and an input of the second amplifier element; and a second switch having a first end connected to the output of the first amplifier element, and a second end. The matching circuit includes a first inductor and a first capacitor connected in series between the output of the second amplifier element and a grounding point. The second end of the second switch is connected to a connecting point of the first inductor to the first capacitor.

13 Claims, 9 Drawing Sheets

POWER AMPLIFIER

BACKGROUND OF THE INVENTION

1. Field of the Invention

The present invention relates to a power amplifier which is used for a mobile phone etc.

2. Background Art

Since power amplifiers occupy a large weight in the power consumption of mobile phones, making power amplifiers highly efficient is important for reducing power consumption. Therefore, power amplifiers for switching a high-power mode and a low-power mode using a switch have been used (for example, refer to Japanese Patent Application Laid-Open No. 7-336168).

SUMMARY OF THE INVENTION

In conventional power amplifiers, the trajectory of impedance viewing the output side from respective points in the output matching circuit for low power has passed through a low-impedance region. Therefore, since much current flows, loss due to the parasitic resistances of inductors, capacitors, and switches has been large. Furthermore, such power amplifiers have been sensitive to the variations of elements, such as inductance and capacitance, or the frequency characteristics.

In view of the above-described problems, an object of the present invention is to provide a power amplifier which can reduce loss and has less sensitive to the variation of elements or frequency characteristics.

According to the present invention, a power amplifier includes: an input terminal from which an input signal is input; a first amplifier element amplifying the input signal; a second amplifier element amplifying an output signal of the first amplifier element; an output terminal from which an output signal of the second amplifier element is output; a matching circuit connected between an output of the second amplifier element and the output terminal; a first switch connected between an output of the first amplifier element and an input of the second amplifier element; and a second switch having a first end connected to the output of the first amplifier element, and a second end. The matching circuit includes a first inductor and a first capacitor connected in series between the output of the second amplifier element and a grounding point. The second end of the second switch is connected to a connecting point of the first inductor to the first capacitor.

The present invention makes it possible to reduce loss and has less sensitive to the variation of elements or frequency characteristics.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
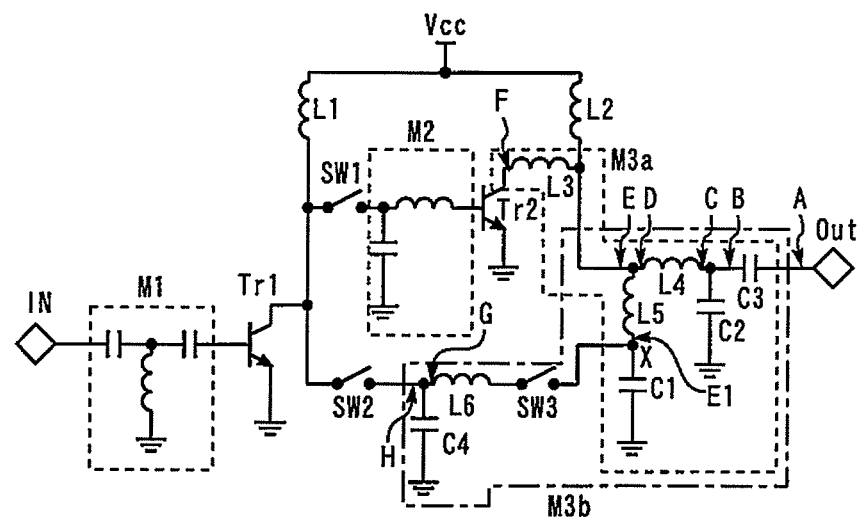
FIG. 1 is a circuit diagram showing a power amplifier according to a first embodiment of the present invention.

FIG. 1 is a circuit diagram showing a power amplifier according to a first embodiment of the present invention. The input (base) of an amplifier element Tr1 is connected to the input terminal IN via a matching circuit M1. A switch SW1 and a matching circuit M2 are connected between the output (collector) of the amplifier element Tr1 and the input of the amplifier element Tr2. A matching circuit M3a is connected between the output of an amplifier element Tr2 and an output terminal OUT.

An end of a switch SW2 is connected to the output of the amplifier element Tr1. The output of the amplifier element Tr1 is connected to the output terminal OUT via the switch SW2 and a matching circuit M3b. To the amplifier elements Tr1 and Tr2, a collector voltage from a power source Vcc is applied via inductors L1 and L2, respectively.

The output matching circuit has a matching circuit M3a for high outputs, and a matching circuit M3b for low outputs, and both are switched by a switch SW3. The matching circuit M3a is constituted by inductors L3, L4, and L5, and capacitors C1, C2, and C3. The matching circuit M3b is constituted by inductors L4, L5, and L6, and capacitors C1, C2, C3, and C4. To reduce loss as much as possible, the matching circuit M3a for high output does not contain a switch SW3, which causes loss.

In matching circuits M3a and M3b, an inductor L5 and a capacitor C1 are connected in series between the output of the amplifier element Tr2 and a grounding point. The other end of the switch SW2 is connected to the connecting point X to connect the inductor L5 and the capacitor C1 via an inductor L6 and a switch SW3.

In effect, although there are a base-bias circuit for applying base current to the base of amplifier elements Tr1, Tr2, and Tr3; switches SW1 to SW5; control circuits for controlling ON/OFF of amplifier elements Tr1, Tr2, and Tr3; and the like; these are omitted in the diagram.

Next, the operation of the first embodiment will be described. In the high-gain high-output mode (the first mode), it is set up that the switch SW1 is ON, the switches SW2 and SW3 are OFF, the transistors Tr1 and Tr2 are ON, respectively. First, the input signals inputted from the input terminal IN are amplified by the amplifier element Tr1. Next, the outputted signals from the amplifier element Tr1 are amplified by the second amplifier element Tr2. Thereafter, the output signals from the amplifier element Tr2 are outputted from the output terminal OUT via the matching circuit M3a for high output.

On the other hand, in the low-gain low-output mode (the second mode), it is set up that the switches SW2 and SW3 are ON, the switch SW1 is OFF, the transistor Tr1 is ON, and the transistor Tr2 is OFF respectively. First, the input signals inputted from the input terminal IN are amplified by the amplifier element Tr1. Thereafter, the output signals from the amplifier element Tr1 are outputted from the output terminal OUT via the matching circuit M3b for low output.

Figure 2:
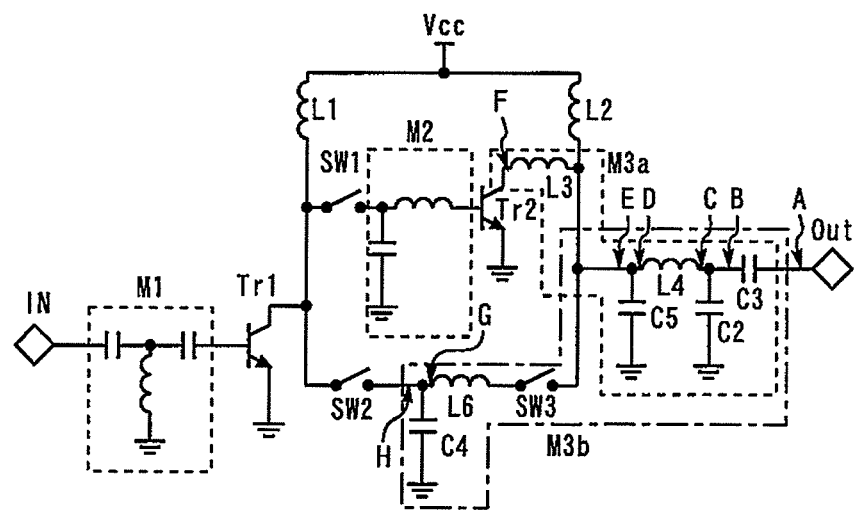
FIG. 2 is a circuit diagram showing a power amplifier according to the comparative example.

Next, the effects of the present embodiment will be described in comparison with a comparative example. FIG. 2 is a circuit diagram showing a power amplifier according to the comparative example. The difference from the first embodiment is that the inductor L5 is absent, and the capacitor C1 is replaced by the capacitor C5. Here, the values of L5 and C1 in the first embodiment are set to be seen as the same capacitance as in the C5 of the comparative example as follows:

$$\frac{1}{j\omega C5} = j\omega L5 + \frac{1}{j\omega C1} \qquad \text{[Formula 1]}$$

Figure 3:
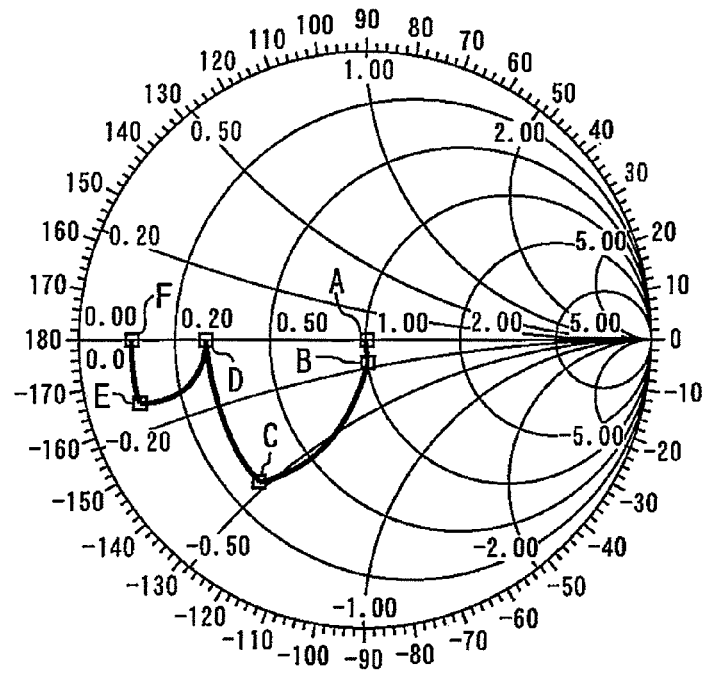
FIG. 3 is a diagram showing the impedances viewing the output side from respective points (A to F) in the matching circuit M3a for high output of the first embodiment of the present invention.

FIG. 3 is a diagram showing the impedances viewing the output side from respective points (A to F) in the matching circuit M3a for high output of the first embodiment of the present invention. Specifically, it is a diagram plotted the impedance at a desired frequency viewing the output side from respective points on the Smith chart of the characteristic impedance, 50Ω. The impedance at respective points of the matching circuit M3a for high output is similar in the comparative example.

Figure 4:
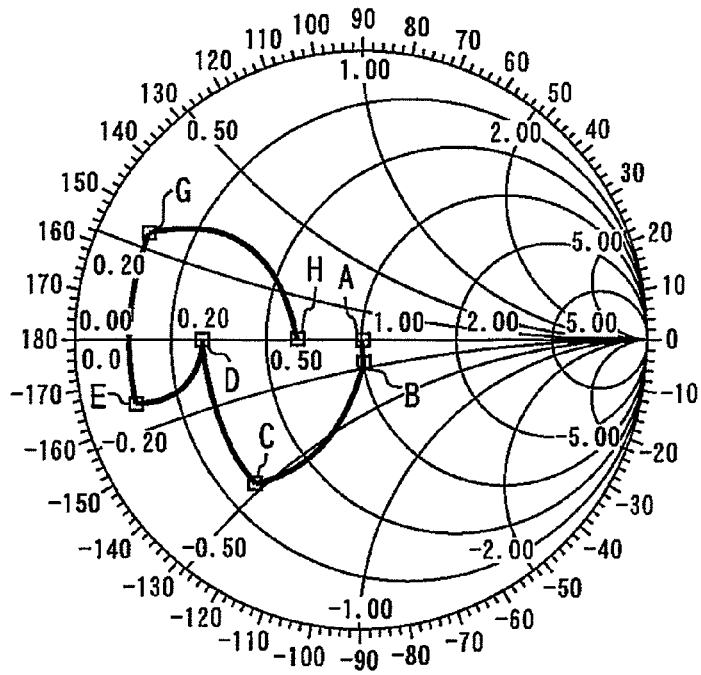
FIG. 4 is a diagram showing the impedances viewing the output side from respective points (A to D, G, and H) in the matching circuit M3b for low output of the comparative example.

FIG. 4 is a diagram showing the impedances viewing the output side from respective points (A to D, G, and H) in the matching circuit M3b for low output of the comparative example. The impedances viewing the output side from the points E and G are low. Therefore, since large current flows, the loss is enlarged via the parasitic resistance of the inductor and the capacitor, or by the parasitic resistance of the switch SW3. Moreover, since the trajectory of the impedances passes through the low-impedance region, the system becomes sensitive to the variation of elements, such as inductance and capacitance, or frequency characteristics.

Figure 5:
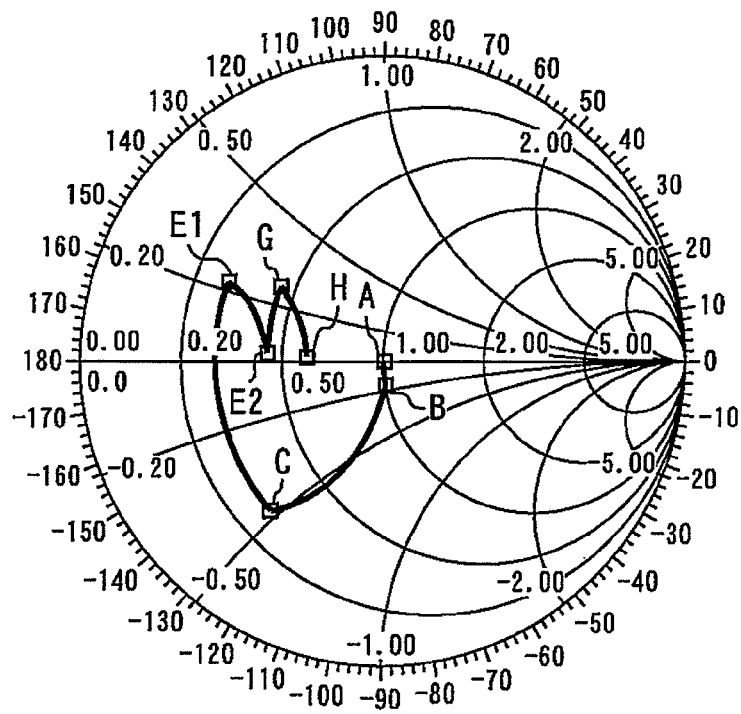
FIG. 5 is a diagram showing the impedances viewing the output side from respective points (A to D, E1, E2, G, and H) in the matching circuit M3b for low output of the first embodiment of the present invention.

On the other hand, FIG. 5 is a diagram showing the impedances viewing the output side from respective points (A to D, E1, E2, G, and H) in the matching circuit M3b for low output of the first embodiment of the present invention. The trajectory of the impedances does not pass through the low-impedance region. Therefore, loss due to the parasitic resistance of the inductor and the capacitor, or due to the parasitic resistance of the switch SW3 is reduced. In addition, the system becomes less sensitive to the variation of elements, such as inductance and capacitance, or frequency characteristics.

Second Embodiment

Figure 6:
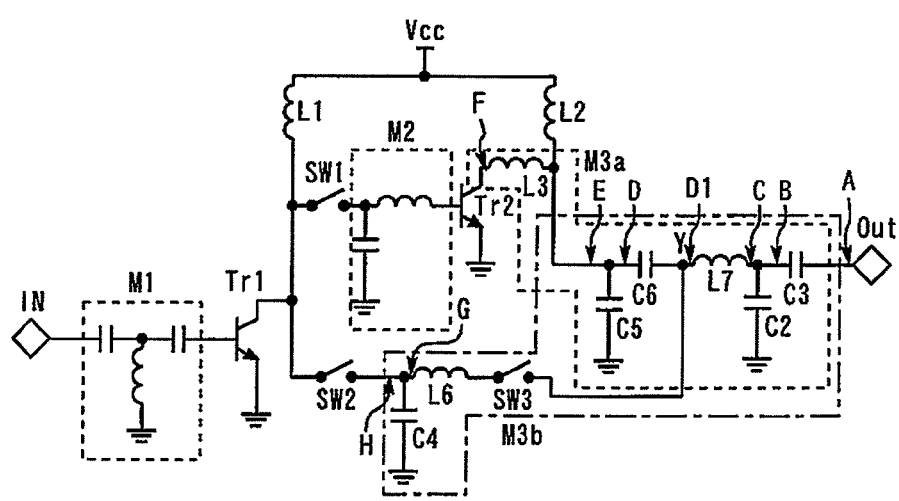
FIG. 6 is a circuit diagram showing a power amplifier according to a second embodiment of the present invention.

FIG. 6 is a circuit diagram showing a power amplifier according to a second embodiment of the present invention. The matching circuit M3a for high output is constituted by inductors L3 and L7, and capacitors C2, C3, C5, and C6. The matching circuit M3b for low output is constituted by inductors L6 and L7, and capacitors C2, C3, C4, C5, and C6. Here, the values of L7 and C6 in the second embodiment are set to be seen as the same inductance as the L4 in the comparative example.

$$j\omega L4 = j\omega L7 + \frac{1}{j\omega C6} \qquad \text{[Formula 2]}$$

In the matching circuits M3a and M3b, an inductor L7 and a capacitor C6 is connected in series between the output of the amplifier element Tr2 and the output terminal OUT. The other end of the switch SW2 is connected to the connecting point Y to connect the inductor L7 and the capacitor C6 via the inductor L6 and the switch SW3. The other components are similar to the components of the first embodiment.

Figure 7:
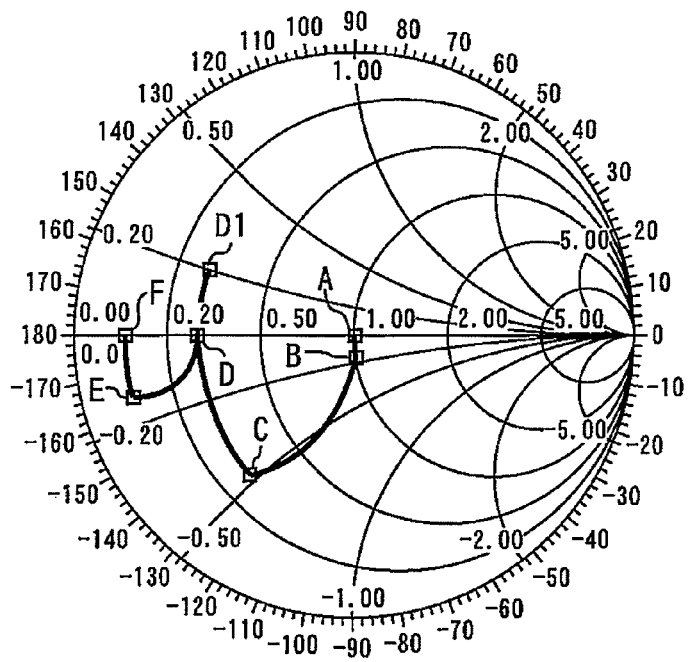
FIG. 7 is a diagram showing the impedances viewing the output side from respective points (A to F, and D1) in the matching circuit M3a for high output of the second embodiment of the present invention.

FIG. 7 is a diagram showing the impedances viewing the output side from respective points (A to F, and D1) in the matching circuit M3a for high output of the second embodiment of the present invention. The impedances at the respective points in the matching circuit M3a for high output are similar to those in the first embodiment and the comparative example.

Figure 8:
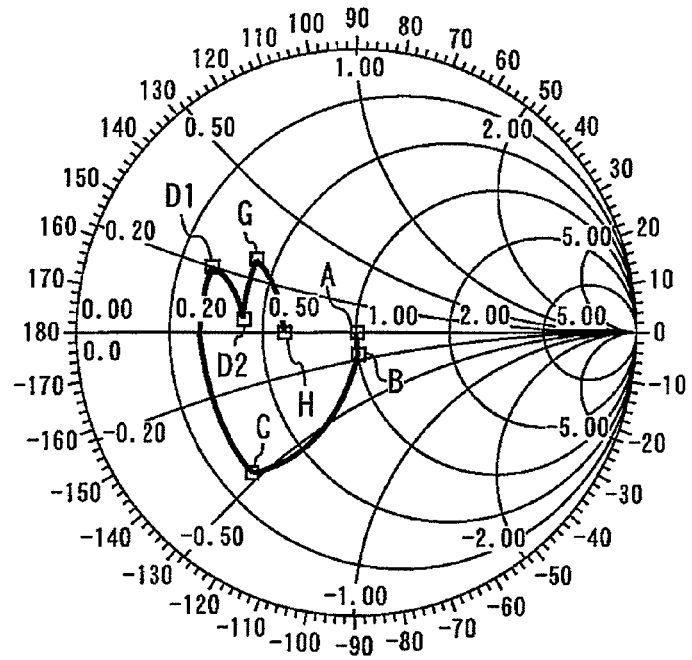
FIG. 8 is a diagram showing the impedances viewing the output side from respective points (A to C, D1, D2, G, and H) in the matching circuit M3b for low output of the second embodiment of the present invention.

FIG. 8 is a diagram showing the impedances viewing the output side from respective points (A to C, D1, D2, G, and H) in the matching circuit M3b for low output of the second embodiment of the present invention. The trajectory of the impedances does not pass through the low-impedance region. Therefore, loss due to the parasitic resistance of the inductor and the capacitor, or due to the parasitic resistance of the switch SW3 is reduced. In addition, the system becomes less sensitive to the variation of elements, such as inductance and capacitance, or frequency characteristics.

Third Embodiment

Figure 9:
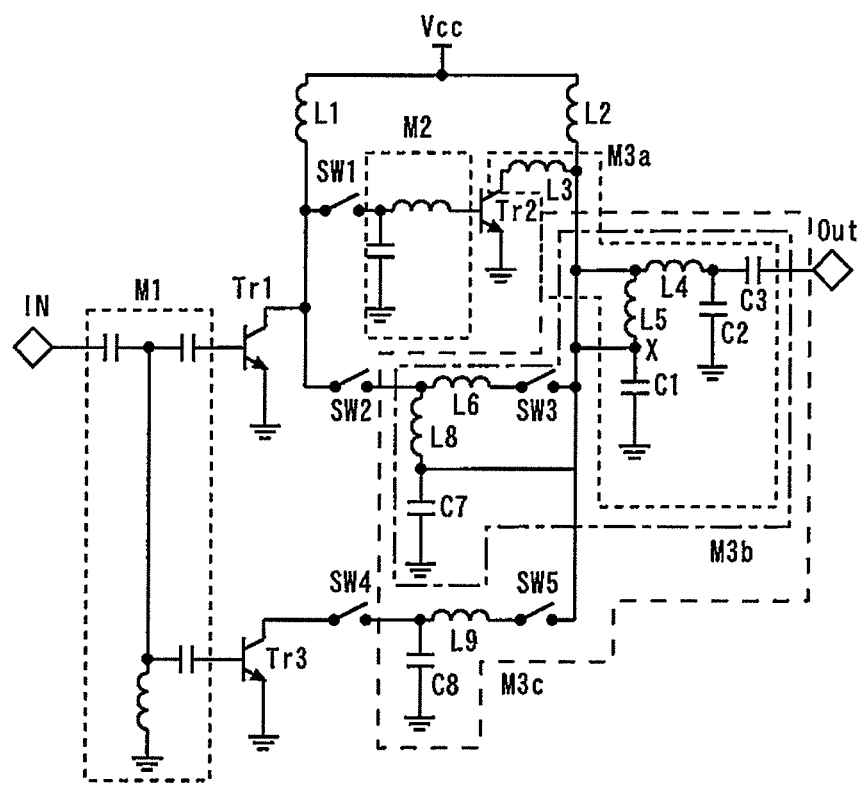
FIG. 9 is a circuit diagram showing a power amplifier according to a third embodiment of the present invention.

FIG. 9 is a circuit diagram showing a power amplifier according to a third embodiment of the present invention. In the third embodiment, the components in the low-gain low-output mode (the third mode) are added to the components of the first embodiment.

The matching circuit M3a for high output is constituted by the inductors L3, L4, and L5, and the capacitors C1, C2, and C3. The matching circuit M3b for low output is constituted by the inductors L4, L5, L6, L8, and L9, and the capacitors C1, C2, C3, C7, and C8. The matching circuit M3c for low output is constituted by the inductor L9, the capacitor C8, and the switch SW5 in addition to the components of the matching circuit M3b.

The inductor L7 and the capacitor C8 are connected in series between the other end of the switch SW2 and the grounding point. The inputted signals are amplified by the third amplifier element Tr3. An end of the switch SW4 is connected to the output port of the amplifier element Tr3. The other end of the switch SW4 is connected between the inductor L8 and the capacitor C7 via the inductor L9 and the switch SW5. The other components are similar to the components of the first embodiment.

The operations of the first and second modes are similar to the operations in the first embodiment. In the third mode, the switches SW1 and SW2 are set to be OFF, the switches SW3, SW4, and SW5 are set to be ON, the amplifier elements Tr1 and Tr2 are set to be OFF, and the amplifier element Tr3 is set to be ON, respectively, by the control circuit.

In the matching circuit M3c, the take-out port Z of the path in the third mode is further on the higher impedance side than the take-out port X of the path in the second mode, because it passes through the inductor L8. Therefore, the loss becomes further lower than the loss in the third mode.

Fourth Embodiment

Figure 10:
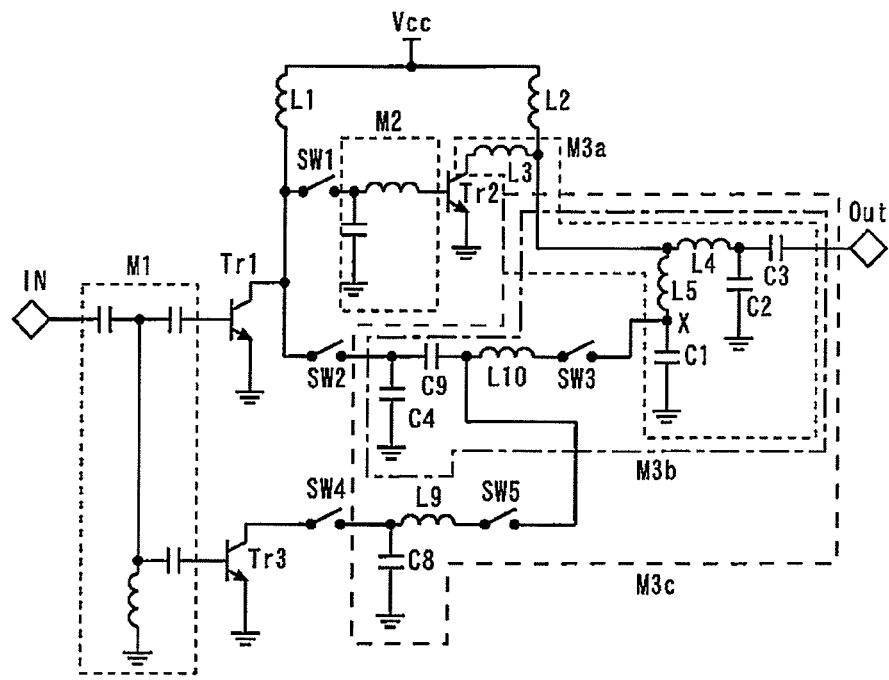
FIG. 10 is a circuit diagram showing a power amplifier according to a fourth embodiment of the present invention.

FIG. 10 is a circuit diagram showing a power amplifier according to a fourth embodiment of the present invention. Between the other end of the switch SW2 and the connecting point X, the inductor L10, the capacitor C9, and the switch SW3 are connected in series. The other end of the switch SW4 is connected between the inductor L10 and the capacitor C9 via the inductor L9 and the switch SW5. Other components are similar to the components of the third embodiment. Thereby, since the impedances of the take-out ports for the second and third modes can be separately set, the adjustment of the matching circuit becomes easy.

Fifth Embodiment

Figure 11:
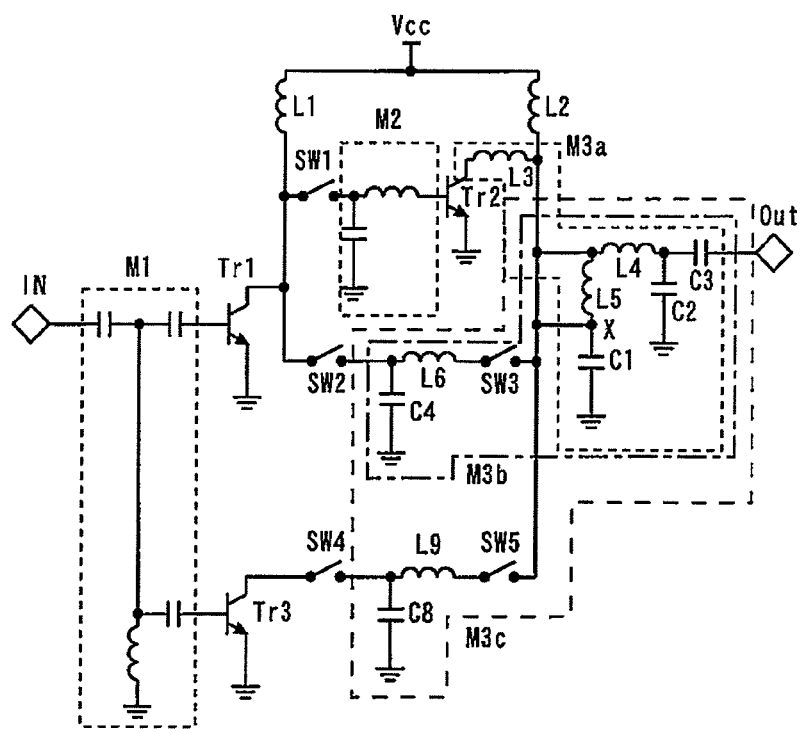
FIG. 11 is a circuit diagram showing a power amplifier according to a fifth embodiment of the present invention.

FIG. 11 is a circuit diagram showing a power amplifier according to a fifth embodiment of the present invention. The other end of the switch SW4 is connected to the connecting point X via the inductor L9 and the switch SW5. Therefore, the take-out location is identical to the take-out port for the second and the third modes, and the path is switched by the switch. Thereby, since the number of switches to be passed through in the third mode is reduced, losses can be lowered.

Sixth Embodiment

Figure 12:
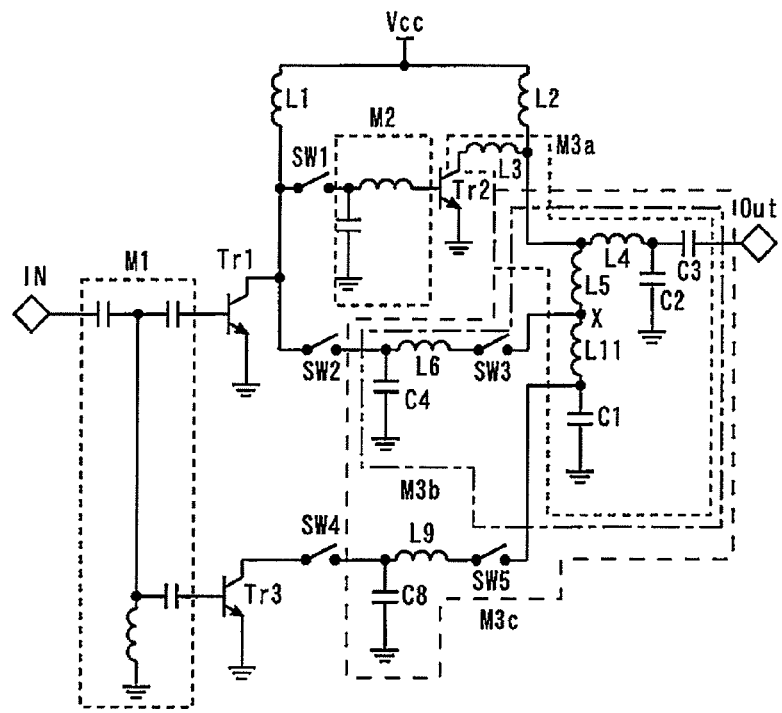
FIG. 12 is a circuit diagram showing a power amplifier according to a sixth embodiment of the present invention.

FIG. 12 is a circuit diagram showing a power amplifier according to a sixth embodiment of the present invention. An inductor L11 is connected between the inductor L5 and the capacitor C1. The other end of the switch SW2 is connected to an end of the inductor L11, and the other end of the switch SW4 is connected to the other end of the inductor L11. The other components are similar to the components in the fifth embodiment. Thereby, since the impedances in the take-out ports for the second and the third mode can be separately set, the adjustment of the matching circuit becomes easy.

Seventh Embodiment

Figure 13:
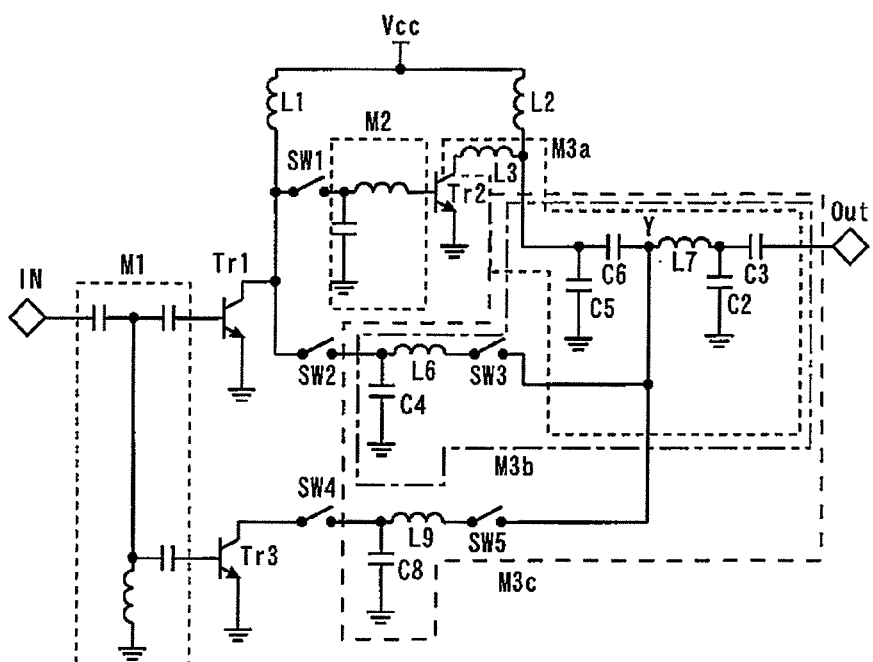
FIG. 13 is a circuit diagram showing a power amplifier according to a seventh embodiment of the present invention.

FIG. 13 is a circuit diagram showing a power amplifier according to a seventh embodiment of the present invention. An end of the switch SW4 is connected to the output port of the amplifier element Tr3. The other end of the switch SW4 is connected to the connecting point Y between the inductor L7 and the capacitor C6 via the inductor L9 and the switch SW5. The other components are similar to the components in the second embodiment.

Therefore, the take-out location is identical to the take-out port for the second and the third mode, and the path is switched by the switch. Thereby, since the number of switches to be passed through in the third mode is reduced, losses can be lowered.

Eighth Embodiment

Figure 14:
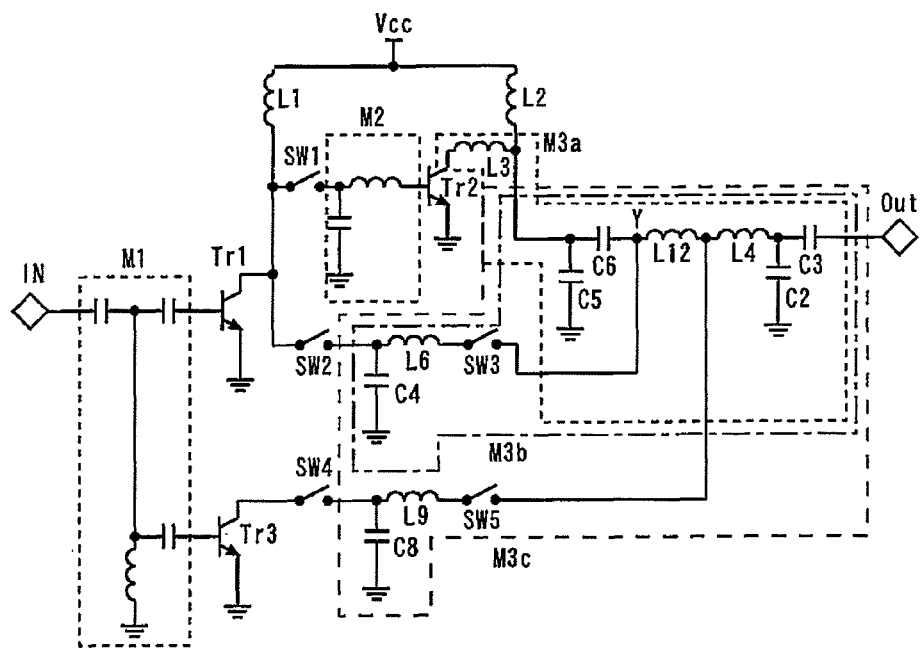
FIG. 14 is a circuit diagram showing a power amplifier according to the eighth embodiment of the present invention.

FIG. 14 is a circuit diagram showing a power amplifier according to the eighth embodiment of the present invention. An inductor L12 is connected between the inductor L4 and the capacitor C6. The other end of the switch SW2 is connected to an end of the inductor L12, and the other end of the switch SW4 is connected to the other end of the inductor L12. The other constitutions are similar to the components in the seventh embodiment. Thereby, since the impedances in the take-out ports for the second and the third mode can be separately set, the adjustment of the matching circuit becomes easy.

Ninth Embodiment

Figure 15:
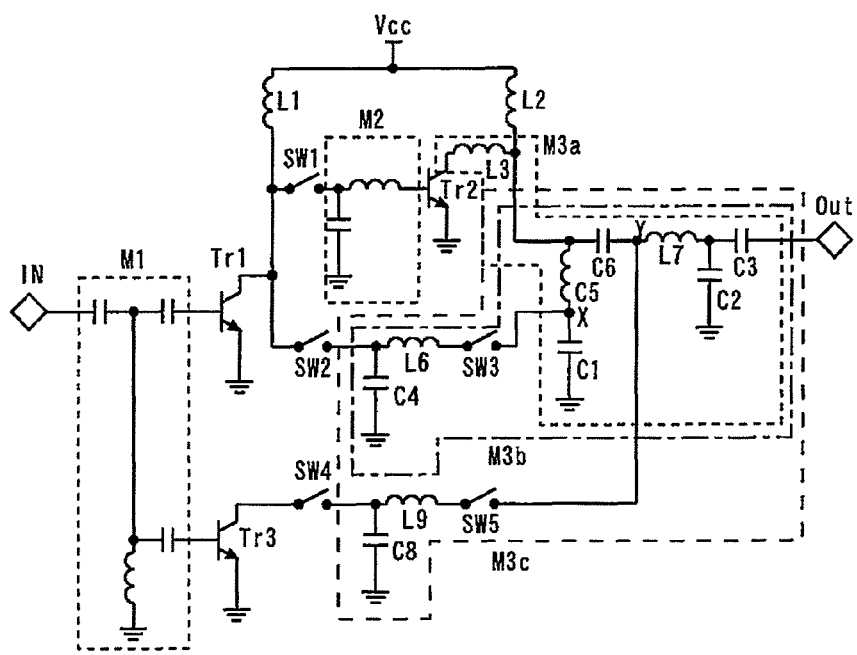
FIG. 15 is a circuit diagram showing a power amplifier according to a ninth embodiment of the present invention.

FIG. 15 is a circuit diagram showing a power amplifier according to a ninth embodiment of the present invention. The other end of the switch SW4 is connected between the inductor L7 and the capacitor C6. In other words, the second mode has the same components as the components in the first embodiment, and the third mode has the same components as the components in the second embodiment. Thereby, since the number of switches to be passed through in the third mode is reduced, losses can be lowered. In addition, since the impedances in the take-out ports for the second and the third mode can be separately set, the adjustment of the matching circuit becomes easy.

Tenth Embodiment

Figure 16:
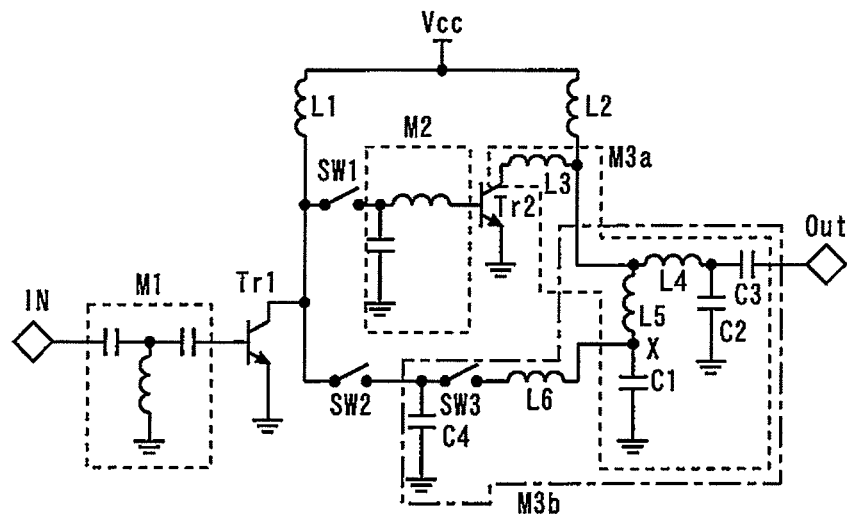
FIG. 16 is a circuit diagram showing a power amplifier according to a tenth embodiment of the present invention.

FIG. 16 is a circuit diagram showing a power amplifier according to a tenth embodiment of the present invention. An inductor L6 is connected to the connecting point X. The switch SW3 is connected between the switch SW2 and the inductor L6. A capacitor C4 is connected between the other end of the switch SW2 and the grounding point. The other components are similar to the components in the first embodiment. Specifically, in comparison with the first embodiment, the locations of the switch SW3 and the inductor L6 are inverted. Since the switch SW3 in the low-output mode is provided in front of the inductor L6, the switch SW3 is placed on the high-impedance point. Therefore, the circuit of lower loss can be realized.

Eleventh Embodiment

Figure 17:
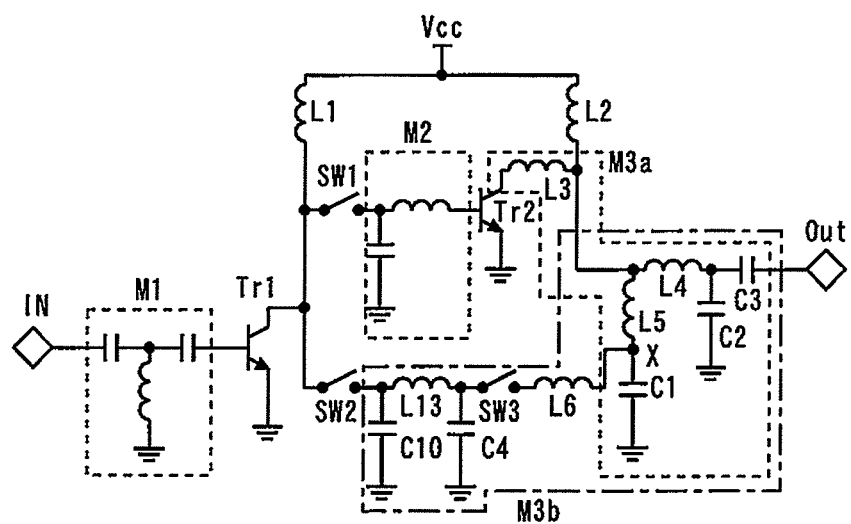
FIG. 17 is a circuit diagram showing a power amplifier according to an eleventh embodiment of the present invention.

FIG. 17 is a circuit diagram showing a power amplifier according to an eleventh embodiment of the present invention. An inductor L13 is connected between the switch SW2 and the switch SW3. A capacitor C10 is connected between the other end of the switch SW2 and a grounding point. A capacitor C4 is connected to an end of the inductor L13, and the capacitor C10 is connected to the other end of the inductor L13. The other components are similar to the components in the tenth embodiment. Since the matching circuit M3b in the time of the low-output mode has the four-step configuration of C-L-C-L, matching can be taken in a wider band than in the first embodiment.

Although two-stage amplifiers have been described in the above-described embodiments, the present invention is not limited thereto, and similar effects can be obtained by multiple-stage amplifiers of two or more stages. In addition, although the amplifier elements Tr1, Tr2, and Tr3 are HBTs (Hetero-Junction Bipolar Transistors) for example, other bipolar transistors, or FETs such as MOSFETs (Metal Oxide Semiconductor Field Effect Transistors), can also be included.

Furthermore, although the matching circuits 3a, 3b, and 3c are constituted by L, C, L, C, and C, they are not limited thereto, as long as capacitors or inductors are used in some parts. The inductor can also be constituted in the transmission line. In addition, although an LC circuit is used as the matching circuit in a low-output mode, another configuration can also be used if it is a circuit that can realize the impedances viewed from the output of the amplifier element Tr1. Although the SW2 and the SW3 are used in mode switching, one of them can be omitted.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-141807, filed on Jun. 27, 2011, including specification, claims, drawings, and summary, on which the Convention priority of the present application is based, is incorporated herein by reference in its entirety.

What is claimed is:

1. A power amplifier comprising:
   an input terminal at which an input signal is input;
   a first amplifier element amplifying the input signal;
   a second amplifier element amplifying an output signal of the first amplifier element;
   an output terminal from which an output signal of the second amplifier element is output;
   a matching circuit connected between an output of the second amplifier element and the output terminal;
   a first switch connected between an output of the first amplifier element and an input of the second amplifier element; and
   a second switch having a first end connected to the output of the first amplifier element, and a second end, wherein
      the matching circuit includes a first inductor and a first capacitor connected in series between the output of the second amplifier element and a grounding point, and
      the second end of the second switch is connected to a connecting point of the first inductor to the first capacitor.

2. The power amplifier according to claim 1, further comprising:
   a third amplifier element amplifying the input signal; and
   a third switch having a first end connected to an output of the third amplifier element, and a second end connected to the connecting point of the first inductor to the first capacitor.

3. The power amplifier according to claim 2, wherein
   the matching circuit further includes a second inductor and a second capacitor connected in series between the output of the second amplifier element and a grounding point, and
   the second end of the third switch is connected to a connecting point of the second inductor to the second capacitor.

4. The power amplifier according to claim 2, wherein
   the matching circuit further includes a second inductor and a second capacitor connected in series between the output of the second amplifier element and the connecting point of the first inductor to the first capacitor, and
   the second end of the third switch is connected to a connecting point of the second inductor to the second capacitor.

5. The power amplifier according to claim 2, wherein
   the matching circuit further includes a second inductor connected between the first inductor and the first capacitor,
   the second end of the second switch is connected to a first end of the second inductor, and
   the second end of the third switch is connected to a second end of the second inductor.

6. The power amplifier according to claim 1, further comprising:
   a third amplifier element amplifying the input signal; and
   a third switch having a first end connected to an output of the third amplifier element, and a second end, wherein
      the matching circuit further includes a second inductor and a second capacitor connected in series between the output of the second amplifier element and the output terminal, and
      the second end of the third switch is connected to a connecting point of the second inductor to the second capacitor.

7. The power amplifier according to claim 1, further comprising:
   a second inductor connected to the connecting point of the first inductor to the first capacitor;
   a third switch connected between the second switch and the second inductor; and
   a second capacitor connected between the second end of the second switch and a grounding point.

8. The power amplifier according to claim 7, further comprising:
   a third inductor connected between the second switch and the third switch; and
   a third capacitor connected between the second end of the second switch and a grounding point, wherein
      the second capacitor is connected to a first end of the third inductor, and
      the third capacitor is connected to a second end of the third inductor.

9. A power amplifier comprising:
   an input terminal at which an input signal is input;
   a first amplifier element amplifying the input signal;
   a second amplifier element amplifying an output signal of the first amplifier element;
   an output terminal from which an output signal of the second amplifier element is output;
   a matching circuit connected between an output of the second amplifier element and the output terminal;
   a first switch connected between an output of the first amplifier element and an input of the second amplifier element; and
   a second switch having a first end connected to the output of the first amplifier element, and a second end, wherein
      the matching circuit includes a first inductor and a first capacitor connected in series between the output of the second amplifier element and the output terminal, and the second end of the second switch is connected to a connecting point of the first inductor to the first capacitor.

10. The power amplifier according to claim 9, further comprising:
a third amplifier element amplifying the input signal; and
a third switch having a first end connected to an output of the third amplifier element, and a second end connected to the connecting point of the first inductor to the first capacitor.

11. The power amplifier according to claim 10, wherein
the matching circuit further includes a second inductor and a second capacitor connected in series between the output of the second amplifier element and a grounding point, and
the second end of the third switch is connected to a connecting point of the second inductor to the second capacitor.

12. The power amplifier according to claim 10, wherein
the matching circuit further includes a second inductor and a second capacitor connected in series between the output of the second amplifier element and the connecting point of the first inductor to the first capacitor, and
the second end of the third switch is connected to a connecting point of the second inductor to the second capacitor.

13. The power amplifier according to claim 10, wherein
the matching circuit further includes a second inductor connected between the first inductor and the first capacitor,
the second end of the second switch is connected to a first end of the second inductor, and
the second end of the third switch is connected to a second end of the second inductor.

* * * * *